US005663724A

United States Patent [19]

Westby

[11] Patent Number: 5,663,724
[45] Date of Patent: Sep. 2, 1997

[54] 16B/20B ENCODER

[75] Inventor: Judy Lynn Westby, Bloomington, Minn.

[73] Assignee: Seagate Technology, Inc., Scotts Valley, Calif.

[21] Appl. No.: 623,400

[22] Filed: Mar. 28, 1996

[51] Int. Cl.⁶ ...................................................... H03M 7/00
[52] U.S. Cl. .............................................. 341/59; 341/106
[58] Field of Search ........................................ 341/59, 106

[56] References Cited

U.S. PATENT DOCUMENTS

| | | | |
|---|---|---|---|
| 4,486,739 | 12/1984 | Franaszek et al. | 340/347 |
| 5,177,482 | 1/1993 | Cideciyan et al. | 341/59 |

*Primary Examiner*—Todd DeBoer
*Attorney, Agent, or Firm*—Kinney & Lange, P.A.

[57] ABSTRACT

A 16-bit data block is partitioned into upper 5-bit and 3-bit sub-blocks and lower 5-bit and 3-bit sub-blocks. During a single clock cycle, a first 5B/6B encoder portion encodes the upper 5-bit sub-block to produce an upper 6-bit sub-block, a first 3B/4B encoder portion encodes the upper 3-bit sub-block to produce an upper 4-bit sub-block, a second 5B/6B encoder portion encodes the lower 5-bit sub-block to produce a lower 6-bit sub-block, and a second 3B/4B encoder portion encodes the lower 3-bit sub-block to produce a lower 4-bit sub-block. During the same clock cycle, the running disparities of the upper 6-bit sub-block, the upper 4-bit sub-block and the lower 6-bit sub-block are simultaneously combinationally passed to the first 3B/4B encoder portion, the second 5B/6B encoder portion and the second 3B/4B encoder portion, respectively, to selectively complement the output sub-block to adjust running disparity. During the next clock cycle, the running disparity of the lower 4-bit sub-block is passed to the first 5B/6B encoder for the same purpose.

15 Claims, 6 Drawing Sheets

Fig. 1 PRIOR ART (PAT. NO. 4,486,739)

16B/20B ENCODER

BACKGROUND OF THE INVENTION

This invention relates to a 16B/20B encoder, and particularly to a parallel implementation of 8B/10B encoders for use in Fibre Channel Arbitrated Loop designs (FCAL).

Recently, the computer industry has adopted use of a fibre channel to handle data transmission between devices. Fibre channels represent significant advantages over Small Computer Standard Interface designs (SCSI). Fibre channels provide significantly higher bandwidths, up to 100 Megabytes per second, compared to 2 to 20 Megabytes per second for SCSI designs. Fibre channels provide greater connectivity of up to 126 devices including the host, as opposed to 15 devices in a typical SCSI environment. The fibre channel can be attached with a single connector and does not require a switch. A fibre channel using fibre optics operates at distances of up to 30 meters between devices, and up to 10 kilometer for an entire channel as compared to a total length of up to 25 meters for SCSI environments. In SCSI environments, errors in data transmission are detected through use of parity, whereas in fibre channels errors are identified by a running disparity and Cyclic Redundancy Check (CRC).

The FCAL is an industry standardized system employing a byte-oriented DC balanced (0,4) run length limited rate 8B/10B partitioned block transmission code scheme. The FCAL operates at a clock frequency of 106.25 MHz. One form of an 8B/10B encoder/decoder is described in U.S. Pat. No. 4,486,739 granted Dec. 4, 1984 for "Byte Oriented DC Balanced (0,4) 8B/10B Partitioned Block Transmission Code" by Franaszek et al., which is incorporated herein by reference. The Franaszek 8B/10B encoder/decoder partitions an 8-bit input word into a 5-bit portion and a 3-bit portion. The 5-bit portion is encoded to a 6-bit output, and the 3-bit portion is encoded with a control bit to a 4-bit output.

A binary, or two-level, code employs ones and zeros usually assigned respective positive and negative values. Run length is defined as the number of identical contiguous symbols (ones or zeros) that appear in a data stream. A large number of contiguous binary ones will produce a highly positive DC signal, whereas a large number of contiguous binary zeros will produce a highly negative DC signal. However, it is important to maintain DC balance in the signal, both in long data strings as well as short data strings. Thus, on a (0,4) code, a symbol is followed by no more than four contiguous identical symbols (meaning a data stream may contain a string of up to five identical symbols before one of opposite value). (The "0" in the 0,4 notation means that a symbol may be followed by no less than zero contiguous identical symbols—meaning that any given symbol may be followed by a symbol of same or opposite value.) The (0,4) code disclosed in the Franaszek et al. patent permits only four characters that might generate five identical contiguous symbols, three of those characters being special characters. Hence, except for those four characters, the (0,4) code disclosed in the Franaszek et al. patent is effectively a (0,3) code.

The disparity of a block of data is the difference between the numbers of ones and zeros in the block. To adjust the DC level of the output string, the Franaszek et al. apparatus compares the running disparity from prior words to the disparity of the current word portion encoded. The output word portion, or a complement thereof, is then output. For example, if the running disparity is +1 and the current output word portion has a disparity of +2, the output portion is complemented to a word portion with a disparity of −2 and a −1 disparity is passed to the next encoding stage. The maximum disparity possible in the Franaszek et al. scheme is +3 and −3, and the disparity at the bounds between the 6-bit output and 4-bit output portions is either +1 or −1. Since the Franaszek et al. encoder is designed so a zero disparity is not possible, the disparity at the bounds between the 6-bit and 4-bit portions is at the minimum values of ±1.

In the Franaszek et al. scheme, the running disparity is passed from one encoding stage to the next, so that the running disparity from the 5B/6B encoder stage is held to encode the 3-bit input portion for the same word in the 3B/4B stage, and the running disparity from the 3B/4B encoder stage is held to encode the 5-bit input portion of the next word in the 5B/6B encoder stage. The holding of the running disparity between the stages required the two encoder stages be operated during different portions of the clock cycle. The output registers therefore are operated on separate portions of the clock.

To achieve wider data paths, a parallel version of the Franaszek 8B/10B encoder was implemented in VHSIC Hardware Description Language (VHDL) format. In the parallel version, one of the 8B/10B encoders encoded the upper half of the 16-bit input word while the other 8B/10B encoder encoded the lower half of the 16-bit word. The disparity was passed in sequence so that the running disparity of the upper 6-bit word portion was passed to the upper 3B/4B encoder, the running disparity of the upper 4-bit word portion was passed to the lower 5B/6B encoder, the running disparity of the lower 6-bit word portion was passed to the lower 3B/4B encoder, and the running disparity of the lower 4-bit word portion was passed to the upper 5B/6B encoder for the next word. To avoid holding each of the running disparities one-half cycle as in the original Franaszek et al. design, the parallel design operated the encoders and buffers on the same clock cycle and held the running disparity of the lower 6-bit word portion for later encoding in the upper 3B/4B encoder. The disparity of the upper 6-bit word portion was combinationally passed to the lower 3B/4B encoder, the disparity of the upper 4-bit word portion was combinationally passed to the lower 5B/6B encoder, and the disparity of the lower 4-bit word portion was combinationally passed to the upper 5B/6B encoder. Considering of a second of the 8B/10B encoders. The running disparity of the 4-bit output sub-block associated with the second 8B/10B encoder is held for processing by the 5B/6B encoder of the first 8B/10B encoder. Hence, during a single clock cycle, the running disparity of the second 4-bit output sub-block of a previous word is combined with the disparity of the current first 6-bit output sub-block and the running disparity of both current 6-bit output sub-blocks and the current first 4-bit output sub-block are combined with the disparities of both current 4-bit output sub-blocks and the current second 6-bit output sub-block, thereby selectively complementing all output sub-blocks for a current data block during a single clock cycle.

According to one aspect of the present invention, a forced disparity control responds to a special character bit and a forced disparity bit to force the running disparity of the 5B/6B encoder of the first encoder to a selected polarity. Preferably, the forced disparity control also passes the running disparity of the selected polarity of the immediately prior 4-bit output sub-block of the second 8B/10B encoder to the 5B/6B encoder of the first 8B/10B encoder.

According to another aspect of the present invention, an end-of-frame control responds to the running disparity of the immediately prior 4-bit output sub-block of the second 8B/10B encoder and an end-of-frame bit to selectively complement a bit of the current 3-bit input sub-block.

In another form of the present invention, a 16-bit data block is partitioned into an upper 5-bit sub-block, an upper 3-bit sub-block, a lower 5-bit sub-block and a lower 3-bit sub-block. During a single clock cycle, a first 5B/6B encoder portion encodes the upper 5-bit sub-block to produce an upper 6-bit sub-block, a first 3B/4B encoder portion encodes the upper 3-bit sub-block to produce an upper 4-bit sub-block, a second 5B/6B encoder portion encodes the lower 5-bit sub-block to produce a lower 6-bit sub-block, and a second 3B/4B encoder portion encodes the lower 3-bit sub-block to produce a lower 4-bit sub-block. During the same clock cycle, the running disparities of the upper 6-bit sub-block, the upper 4-bit sub-block and the lower 6-bit sub-block are simultaneously combinationally passed to the first 3B/4B encoder portion, the second 5B/6B encoder portion and the second 3B/4B encoder portion, respectively. During the next clock cycle, the running disparity of the lower 4-bit sub-block is passed to the first 5B/6B encoder.

More particularly, a binary data encoding apparatus according to the present invention produces a DC balanced run length limited rate 16B/20B code from an unconstrained input data stream that includes consecutive 16-bit data blocks. A first 8B/10B encoder receives an upper 8 bits of a data block and a second 8B/10B encoder receives a lower 8 bits of the data block. The first 8B/10B encoder includes a 5B/6B encoder for encoding an upper 5-bit sub-block into a 6-bit output data sub-block, and a 3B/4B encoder for encoding an upper 3-bit sub-block into a 4-bit output data sub-block. The first 8B/10B encoder also includes means for determining a disparity of the current 6-bit and 4-bit output sub-blocks and for determining a running disparity associated with each. The 3B/4B encoder of the first 8B/10B encoder is responsive to the disparity of the current upper 4-bit sub-block and to the running disparity of the current upper 6-bit sub-block to selectively complement the current upper 4-bit sub-block to reduce running disparity. The second 8B/10B encoder includes a 5B/6B encoder for encoding a lower 5-bit sub-block into a 6-bit output data sub-block, and a 3B/4B encoder for encoding a lower 3-bit sub-block into a 4-bit output data sub-block. The second 8B/10B encoder also includes means for determining a disparity of the current 6-bit and 4-bit output sub-blocks and for determining a running disparity associated with each. The 5B/6B encoder of the second 8B/10B encoder is responsive to the disparity of the current lower 6-bit sub-block and to the running disparity of the current upper 4-bit sub-block to selectively complement the current lower 6-bit sub-block to reduce running a 16-bit input data word composed of two 8-bit portions; the 16B/20B encoder provided the upper 8-bit portion during a first clock cycle and the lower 8-bit portion during the next clock cycle.

However the 16B/20B encoder required buffering both before and after the encoder to permit the 3-bit and 5-bit codes to be staged in and the 4-bit and 6-bit codes to be staged out and alignment of the full 20-bit output word. As in the prior Franaszek et al. design, the additional buffering represented increased gate count for the fibre channel port. Moreover, the parallel version required at least two clock cycles to encode a 16-bit input word to a 20-bit output word, thereby affecting system timing.

SUMMARY OF THE INVENTION

The present invention is directed to an improved parallel 8B/10B encoder for use in FCALs that eliminates buffering both before and after the encoder (thereby reducing the gate count over the prior art), outputs the entire 20-bit word in a single clock cycle, and removes certain loop latency encountered by the prior art.

In one form of the invention, a binary data encoding apparatus produces a DC balanced run length limited rate 16B/20B code from an unconstrained input data stream that includes consecutive 16-bit data blocks. The encoding apparatus includes a pair of parallel 8B/10B encoders each having a 5B/6B and a 3B/4B encoder portion responsive to respective 5-bit and 3-bit sub-blocks to produce respective 6-bit and 4-bit output sub-blocks. Each encoder portion is responsive to input data and a running disparity associated with another sub-block to selectively complement the bits of its output sub-block to reduce running disparity. The running disparity of each 6-bit output sub-block is combinationally passed to the 3B/4B encoder of the associated 8B/10B encoder and the running disparity of the 4-bit output sub-block associated with a first of the 8B/10B encoders is combinationally passed to the 5B/6B encoder disparity. The 3B/4B encoder of the second 8B/10B encoder is responsive to the disparity of the current lower 4-bit sub-block and to the running disparity of the current lower 6-bit sub-block to selectively complement the current lower 4-bit sub-block to reduce running disparity. The 5B/6B encoder of the first 8B/10B encoder is responsive to the disparity of the current upper 6-bit sub-block and to the running disparity of the prior lower 4-bit sub-block to selectively complement the current upper 6-bit sub-block to reduce running disparity.

Operationally, the running disparity of the upper 6-bit, upper 4-bit and lower 6-bit output sub-blocks are combinationally passed to the respective 3B/4B and 5B/6B encoders for a first data block. The running disparity of the lower 4-bit output sub-block for the 5B/6B encoder of the first 8B/10B encoder is stored for the next data block.

DETAILED DESCRIPTION OF THE PREFERRED EMBODIMENTS

Figure 1:
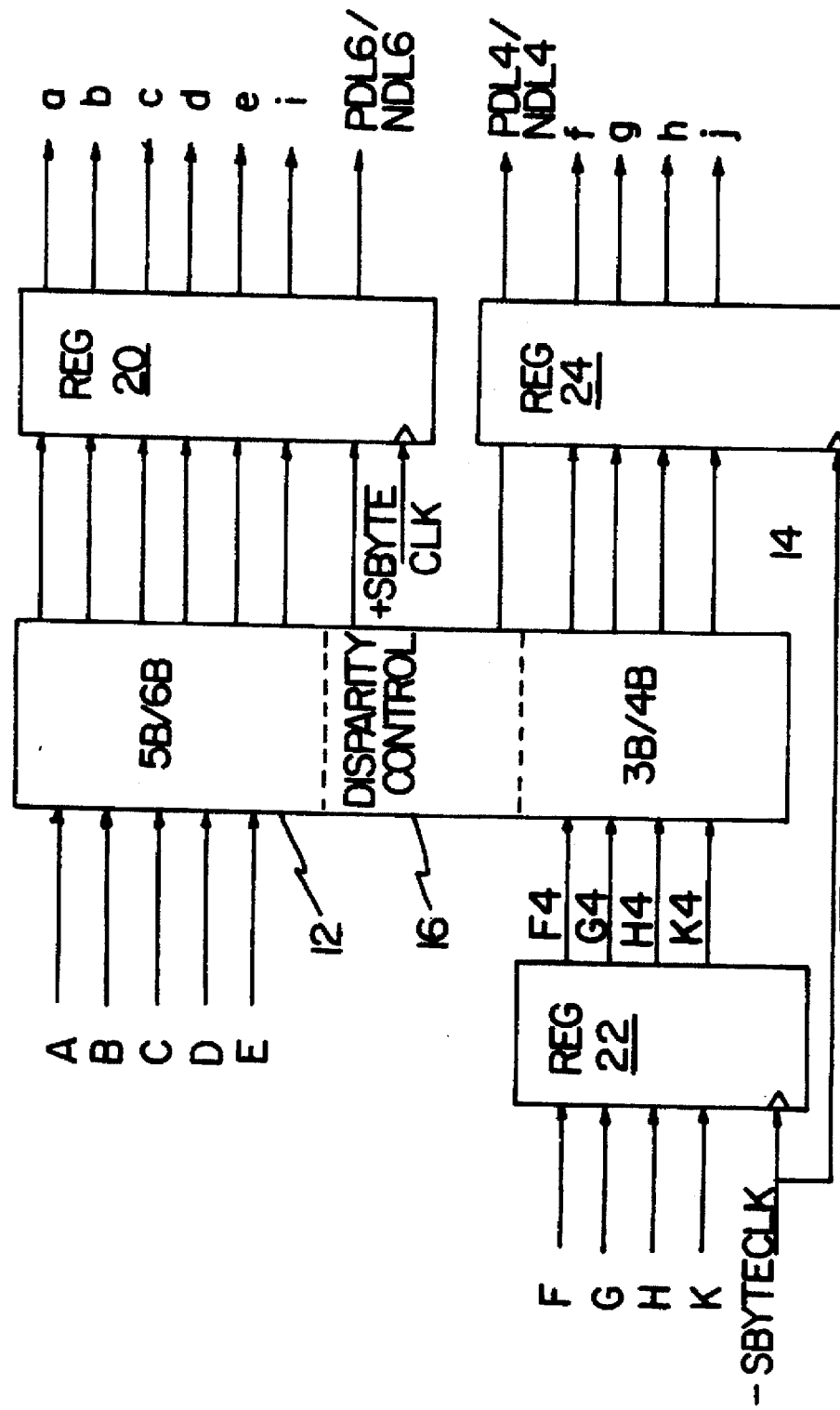
FIG. 1 is a block diagram representation of a 8B/10B encoder described in Franaszek et al. U.S. Pat. No. 4,486,739.
Figure 2:
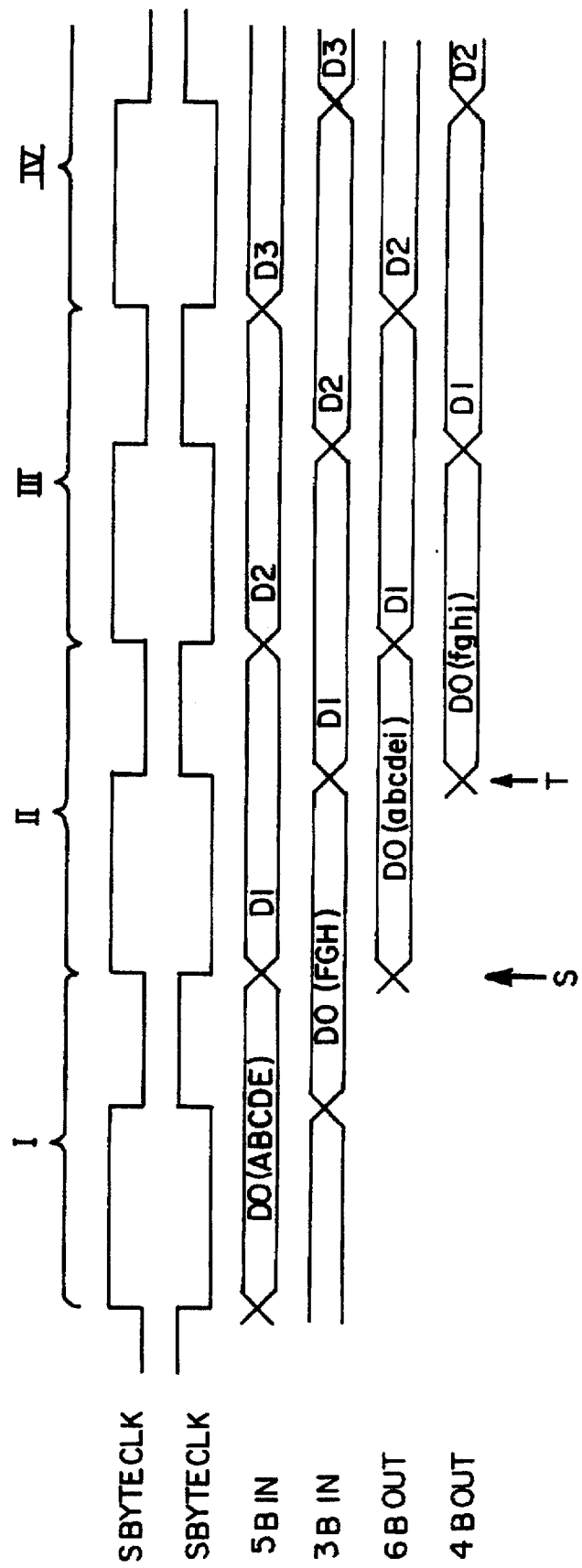
FIG. 2 is a timing diagram of the encoder illustrated in FIG. 1.

FIGS. 1 and 2, taken together, illustrate the operation of the 8B/10B encoder described in the Franaszek et al. U.S. Pat. No. 4,486,739 granted Dec. 4, 1984 for "Byte Oriented DC Balanced (0,4) 8B/10B Partitioned Block Transmission Code", incorporated herein by reference. More particularly, FIG. 1 is a block diagram illustrating binary data inputs and outputs of the Franaszek encoder, and FIG. 2 illustrates certain timing aspects of the Franaszek encoder. For sake of consistency and to the extent practical, notation herein is the same as in the Franaszek et al patent. Thus, uppercase characters indicate input data lines while lowercase characters indicate output data lines. The eight input data bits are shown as ABCDE and FGH. Control bit K indicates special characters, as described in the Franaszek et al. patent. Input bits A, B, C, D and E are encoded by 5B/6B section 12 to a 6-bit output stored in register 20. The output signals are clocked into register 20 by the positive edge of sender byte clock +SBYTECLK pulse. Register 20 is shown in part at FIG. 7 of the Franaszek patent. For sake of simplicity, register 20 is also shown as carrying the disparity output from disparity control 16. Thus, based upon the running disparity of the upper portion of the byte, a bit is set to one or zero to indicate a PDL6 or NDL6 running disparity. The output of register 20 includes the 6 output bits a, b, c, d, e and i.

Figure 4:
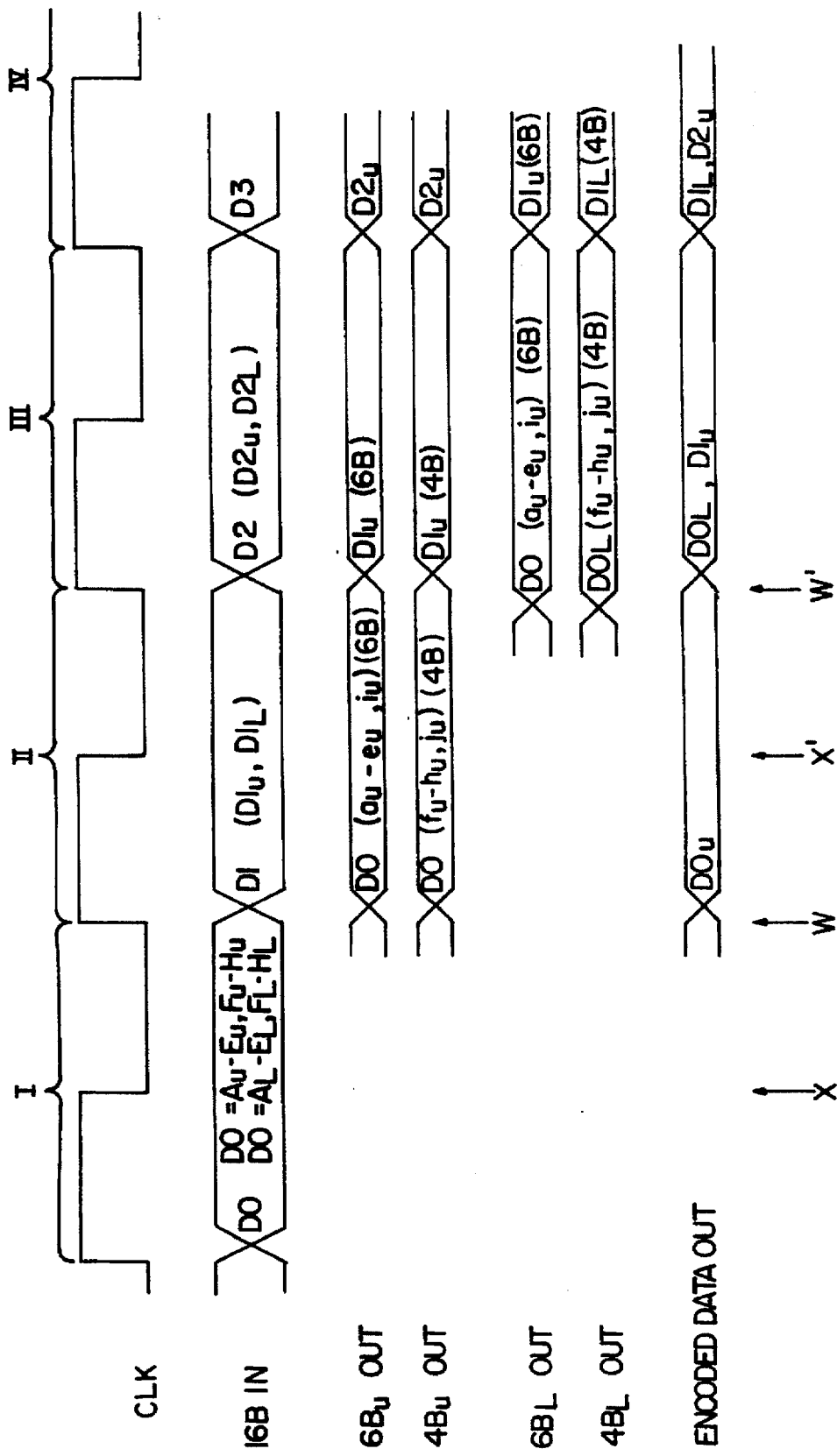
FIG. 4 is a timing diagram of the encoder illustrated in FIG. 3.

The lower three input bits F, G and H and control bit K are clocked into register 22 by the positive edge of the −SBYTECLK pulse. As shown particularly in FIG. 2, the −SBYTECLK signal is the complement of the +SBYTECLK signal, the +SBYTECLK signal being active during a greater portion of the clock cycle than the −SBYTECLK signal for serial processing of the 5-bit and 3-bit inputs, respectively. See FIG. 9 of the Franaszek et al. patent. The clocked data bits F4, G4, H4 and K4 from register 22 are processed by the 3B/4B encoder 14 described in the Franaszek et al. patent and output to register 24. Register 24 is also clocked by the positive edge of the −SBYTECLK signal to output the output bits f, g, h and j. Additionally, the running disparity of the lower portion of the 8-bit byte is identified by a bit value of one or zero to indicate a PDL4 or NDL4 running disparity. Register 22 is shown in FIG. 4 of the Franaszek et al. patent and register 24 is shown in part in FIG. 8 of the Franaszek et al. patent. As in the case of the disparity bit shown in connection with register 20, the PDL4/NDL4 disparity bit is shown output from register 24 for sake of simplicity.

As described in the Franaszek et al. patent, the state of the running disparity of the upper bits is used to generate a complementation bit, COMPLS4, and the state of the PDL4/NDL4 flag is used to generate a complementation bit COMPLS6. These bits are used to complement or not complement the output abcdei or fghj bits. Hence, the running disparity from the 5B/6B encoder is used to complement the output of the 3B/4B encoder, and the running disparity from the 3B/4B encoder is used to complement the output of the 5B/6B encoder.

FIG. 2 illustrates the timing of the Franaszek et al. encoding system. Each data word, consisting of the 8 bits ABCDEFGH are input during a first clock cycle I, commencing with the positive edge of the +SBYTECLK pulse. The upper input data bits ABCDE are processed by the 5B/6B encoder and the output data bits abcdei are clocked into register 20 by the positive edge of +SBYTECLK. As explained in the Franaszek et al. patent, depending upon the disparity of the input bits and the running disparity in disparity control 16, the output bits may or may not be complemented. The running disparity PDL6 or NDL6 operates on the lower portion of the byte, which had been buffered by register 22, to thereby complement or not complement the fghj output stored in register 24. Thus, as shown particularly in FIG. 2, input data word D0 enters the encoder during clock cycle I, and the upper portion abcdei of data word D0 is output during clock cycle II. As indicated at S, the running disparity of the 6-bit output of data word D0 is held and used to encode the 4-bit output of data word D0. Because register 24 is clocked by the positive edge of −SBYTECLK, the 4-byte output fghj for data word D0 is output later than the 6-bit output abcdei. Moreover, as indicated at T, the running disparity of the 4-bit output of data word D0 is held and used to encode the 6-bit output of data word D1.

Thus it will be appreciated that the Franaszek et al. patent describes an 8B/10B encoder in which the 10 output bits are skewed such that the upper 6 bits are output ahead of the 4 lower bits.

The DC level of the output string is adjusted by comparing the running disparity from prior words to the disparity of the current word portion encoded. The output word portion, or a complement thereof, is then output. For example, if the running disparity is +1 and the current output word portion has a disparity of +2, the output portion is complemented to a form a word portion with a disparity of −2. Therefore, a −1 disparity is passed to the next encoding stage. The maximum disparity is +3 and −3, and the disparity at the bounds between the 6-bit output and 4-bit output portions is either +1 or −1. Since the Franaszek et al. encoder is designed so a zero disparity is not possible, the disparity at the bounds between the 6-bit and 4-bit portions is at the minimum values of ±1.

Figure 3:
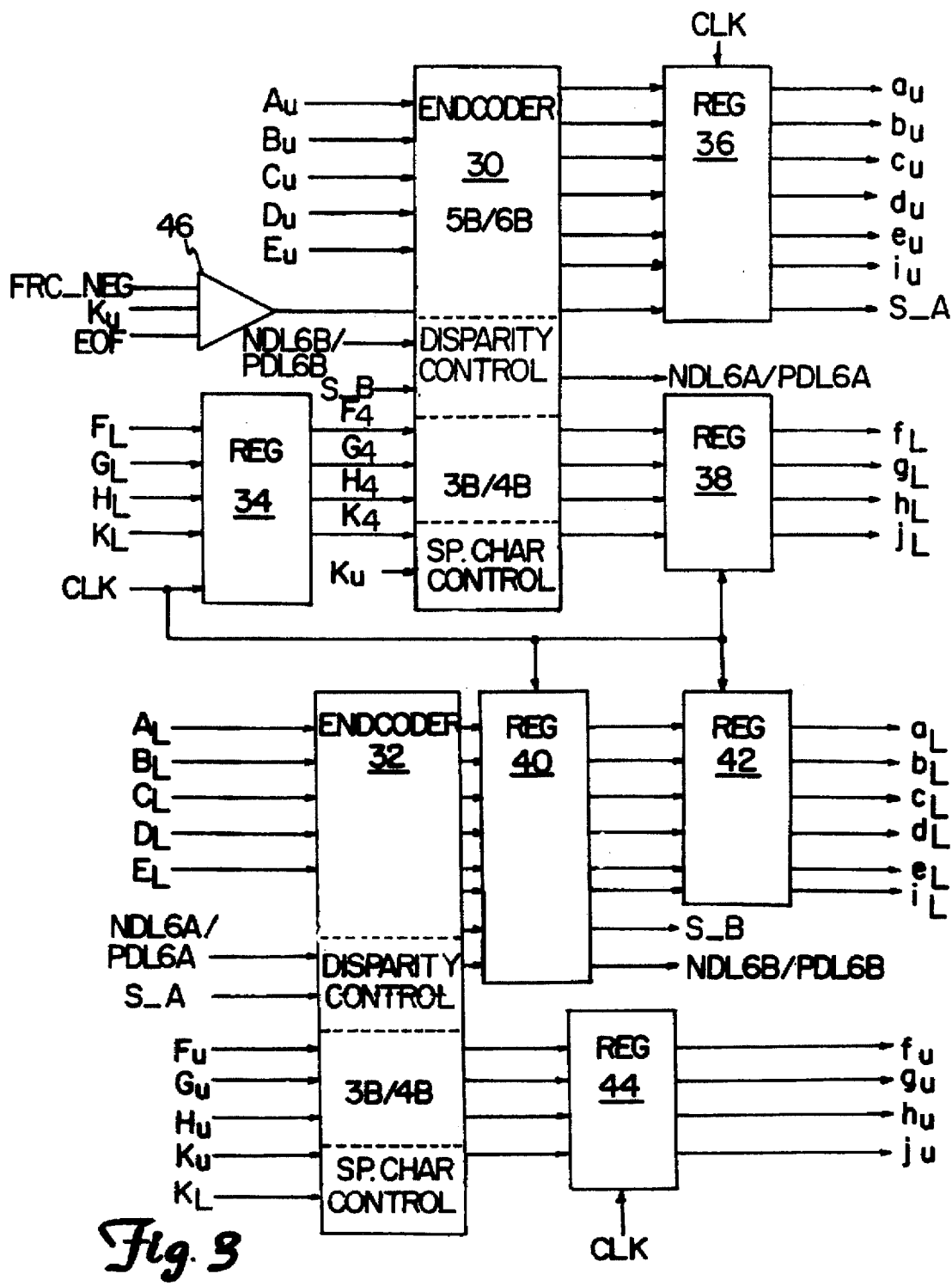
FIG. 3 is a block diagram representation of a prior art 16B/20B encoder employing parallel 8B/10B encoders.

FIG. 3 is a block diagram illustrating a prior art 16B/20B encoder employing a pair of parallel 8B/10B encoders as in FIG. 1. FIG. 4 is a timing diagram of the apparatus of FIG. 3. Encoders 30 and 32 are similar to the encoder illustrated in FIG. 1 and each includes a 5B/6B encoder, 3B/4B encoder, special character control and a disparity control. A 16-bit input word comprises bits $A_U$–$H_U$ and $A_L$–$H_L$, designating the upper and lower 8 bits of the 16-bit word. Bits $A_U$–$E_U$ are input directly to the 5B/6B portion of encoder 30, and bits $A_L$–$E_L$ are input directly to the 5B/6B portion of encoder 32. Bits $F_U$–$H_U$, $K_U$ and $K_L$ are input directly into the inputs of the 3B/4B portion of encoder 32 and bits $F_L$–$H_L$ and $K_L$ are input to a register 34 which in turn provides bits $F_4$–$H_4$ and $K_4$ to the input of the 3B/4B portion of encoder 30. Control bit $K_U$ is also input to the special character control of encoder 30. The output of of the 5B/6B portion of encoder 30 is provided to register 36 to provide the $a_U$–$e_U$ and $i_U$ outputs and the 3B/4B portion of encoder 30 provides outputs to register 38 to provide the $f_L$–$h_L$ and $j_L$ outputs. The output of the 5B/6B portion of encoder 32 provides outputs to register 40 which in turn provides outputs to register 42 to provide the $a_L$–$e_L$ and $i_L$ outputs. The 3B/4B portion of encoder 32 provides outputs through register 44 to provide the $f_U$–$h_U$ and $j_L$ outputs. Registers 34, 36, 38, 40, 42 and 44 are all operated by a single clock signal CLK to operate on the positive edge of the pulses thereof. Thus, unlike the apparatus illustrated in FIG. 1, the registers in FIG. 3 all operate on the same positive clock pulse edge. Conversely, in FIG. 1 register 20 operates on the positive edge of +SBYTECLK while registers 22 and 24 operate on the positive edge of −SBYTECLK.

A running disparity bit NDL6A/PDL6A is based on the running disparity from the 5B/6B portion of encoder 30 is provided to the disparity control of encoder 32. The running disparity bit NDL6B/PDL6B, based on the running disparity from the 5B/6B portion of encoder 32 is provided to the disparity control of encoder 30. Thus, the NDL6B/PDL6B bit is set to zero or one based upon whether the running disparity of the upper portion of the byte is negative or positive.

Gate 46 is responsive to a $KU_4$ bit, EOF bit and FRC_NEG bit to operate the disparity control of encoder, 30 to set the running disparity negative, without having to reset the encoder or input a special data pattern. The $K_4$ bit is the $K_L$ bit of the prior word. The EOF bit is an end-of-frame bit which causes the encoder to select a proper end of frame delineator based on the current running disparity at the end of the frame. The FRC_NEG bit is a force-negative bit to force the running disparity of encoder 30 to be set negative at any time.

As shown in FIG. 4, during a first clock cycle I, the 16-bit data word D0 is input, comprising 8-bit portions $D0_U$ and $D0_L$. $D0_U$ comprises bits $A_U-E_U$ and $F_U-H_U$ while $D0_L$ comprises bits $A_L-E_L$ and $F_L-H_L$. The upper portion $D0_U$ is input directly into encoders 30 and 32 and encoded by the 5B/6B section of encoder 30 and the 3B/4B section of encoder 32 during clock cycle I. Also during clock cycle I, bits $A_L-E_L$ of the lower portion $D0_L$ are input directly into encoder 32 and encoded by the 5B/6B section of encoder 32, and bits $F_L-H_L$ and $K_L$ are loaded into register 34. At the positive edge of the next clock pulse (start of clock cycle II), the outputs $a_U-e_U$, $i_U$ and $f_U-h_U$, $j_U$ ($DO_U$) of the 5B/6B section of encoder 30 and the 3B/4B section of encoder 32 are loaded into registers 36 and 44 for direct output during clock cycle II, and the outputs $a_L-e_L$, $i_L$ of the 5B/6B section of encoder 32 are loaded into register 40. Also during clock cycle II, the 3B/4B section of encoder 30 encodes input bits $F_L-H_L$ and $K_L$ to provide outputs to register 38. Also during clock cycle II, the bits of the second data word D1 are provided to the inputs of encoders 30 and 32 and register 34. At the positive edge of the next clock pulse (clock cycle III), the output of the 3B/4B portion of encoder 30 is clocked into register 38 to provide the $f_L-h_L$ and $j_L$ outputs for $DO_L$ and the output of register 40 is clocked into register 42 to provide the $a_L-e_L$ and $i_L$ for $DO_L$. Similarly, during the third clock cycle, the bits of $D1_U$ are processed through encoders 30 and 32 for output through registers 36 and 44.

During each clock cycle and as indicated at X (or X'), the running disparity of the 6-bit section of the lower portion of a word, such as $DO_L$ is used in the 3B/4B section of encoder 30 to encode the 4-bit section of the lower portion of the same word, $DO_L$. This is accomplished by the NDL6B/PDL6B disparity bit generated by the 5B/6B section of encoder 32 during the encoding of the 6-bit portion of $DO_L$ which is stored in register 40. During the next clock cycle (clock cycle II) the NDL6B/PDL6B bit is passed to the disparity control of encoder 30 to selectively complement or not complement the 4-bit portion of $DO_L$.

Also during each clock cycle, the running disparity of the encoded 4-bit portion of $DO_L$ is combinationally passed by the disparity control of encoder 30 to encode the 6-bit section of the upper portion of the next word. Thus, in the example of FIG. 4, during clock cycle II, the running disparity of the 4-bit section of $DO_L$ is combinationally passed to the 5B/6B portion of encoder 30 to selectively complement or not complement the 6-bit section of word $D1_U$ in the 5B/6B portion of the register 30.

Also during each clock cycle, the running disparity of the 6-bit section of the upper portion of a word is passed combinationally to selectively complement or not complement the 4-bit output of the upper portion of the same word. This is accomplished by the NDL6A/PDL6A disparity bit generated by the 5B/6B portion of encoder 30 during the encoding of the 6-bit portion of the upper portion of the word. In the example of FIG. 4, the running disparity of the 6-bit portion of $DO_U$ is passed during clock cycle I by to selectively complement or not complement the 4-bit portion of $DO_U$ in encoder 32. Likewise, during clock cycle II, the running disparity of the 6-bit portion of $D1_U$ is passed to selectively complement or not complement the 4-bit portion of $D1_U$.

Also during each clock cycle, the running disparity of the 4-bit section of the upper portion of a word is passed combinationally by the disparity control of encoder 32 to selectively complement or not complement the 6-bit output of the lower portion of the word. In the example of FIG. 4, the running disparity of the 4-bit portion of $DO_U$ is passed during clock cycle I to selectively complement or not complement the 6-bit portion of $DO_L$, in encoder 32. Likewise, during clock cycle II, the running disparity of the 4-bit portion $D1_U$ is passed to selectively complement or not complement the 6-bit portion of $D1_L$.

It will be appreciated that the example assumes a start of the process with word D0. Since the 6-bit portion of $DO_L$ is held in registers 40 and 42 a total of two clock cycles, and since the 4-bit portion of $DO_L$ is held a total of two clock cycles in registers 34 and 38, $DO_L$ is not available for output until one clock cycle after $DO_U$. Moreover, it will be appreciated that disparity bit NDL6B/PDL6B is stored for one clock cycle in register 40 so that the 6-bit section of the lower portion of one word operated on the 4-bit portion of the lower portion of the same word (so that $DO_L$ is processed one clock cycle after $DO_U$). Moreover, the disparity of the 4-bit section of the lower portion of a word is processed simultaneously with the 6-bit section of the upper portion of the next word in encoder 32. Thus, the disparity from the 4-bit lower portion of a word is passed to the 6-bit upper portion of the next word.

As reflected in FIG. 4, the encoded data output from the encoder system shown in FIG. 3 is such that the upper portion of a word is output during one clock cycle and the lower portion of the word is output during the next clock cycle. Hence, it will be appreciated that the output of the full D0 word does not occur until two clock cycles following input.

As shown in FIG. 3, the special character control portions of encoders 30 and 32 receive the K bits of both the upper and lower portions of the current word being processed. This is necessary because, as shown in the Franaszek et al. patent, the K bit of an 8-bit word being encoded is applied to the 5B/6B and 3B/4B sections of the encoder. In the circuit of FIG. 3, encoder 30 is processing the 5-bit section of the upper portion of the 16-bit word and the 3-bit section of the lower portion of a 16-bit word. Consequently, the special character control of encoder 30 requires the $K_U$ bit for the 5B/6B portion of the encoder and the $K_4$ bit for the 3B/4B portion of the encoder. Likewise, the special character control of encoder 32 requires the $K_U$ bit for the 5B/6B portion of the encoder and the $K_L$ bit for the 3B/4B portion of the encoder. Also, FIG. 3 illustrates an S_A bit output from the 5B/6B portion of encoder 30 to the disparity control of encoder 32, and an S_B bit output from the 5B/6B portion of encoder 32, through register 40, to the disparity control of encoder 30. As shown in FIGS. 4 and 8 of the Franaszek et al. patent, an S bit is output from the 5B/6B portion of the 8-bit encoder to the 3B/4B portion of the same encoder. Because encoders 30 and 32 process the 5-bit and 3-bit sections of different half-portions of a 16-bit word, it was necessary to transfer the S bit from one encoder to the other, as bits S_A and S_B.

The present invention is directed to a 16B/20B encoder employing parallel 8B/10B encoders as in FIG. 1 but is capable of outputting the full encoded data word within one clock signal of input. The apparatus for accomplishing this is illustrated in FIG. 5 and the timing diagram associated with that apparatus is shown in FIG. 6.

Figure 5:
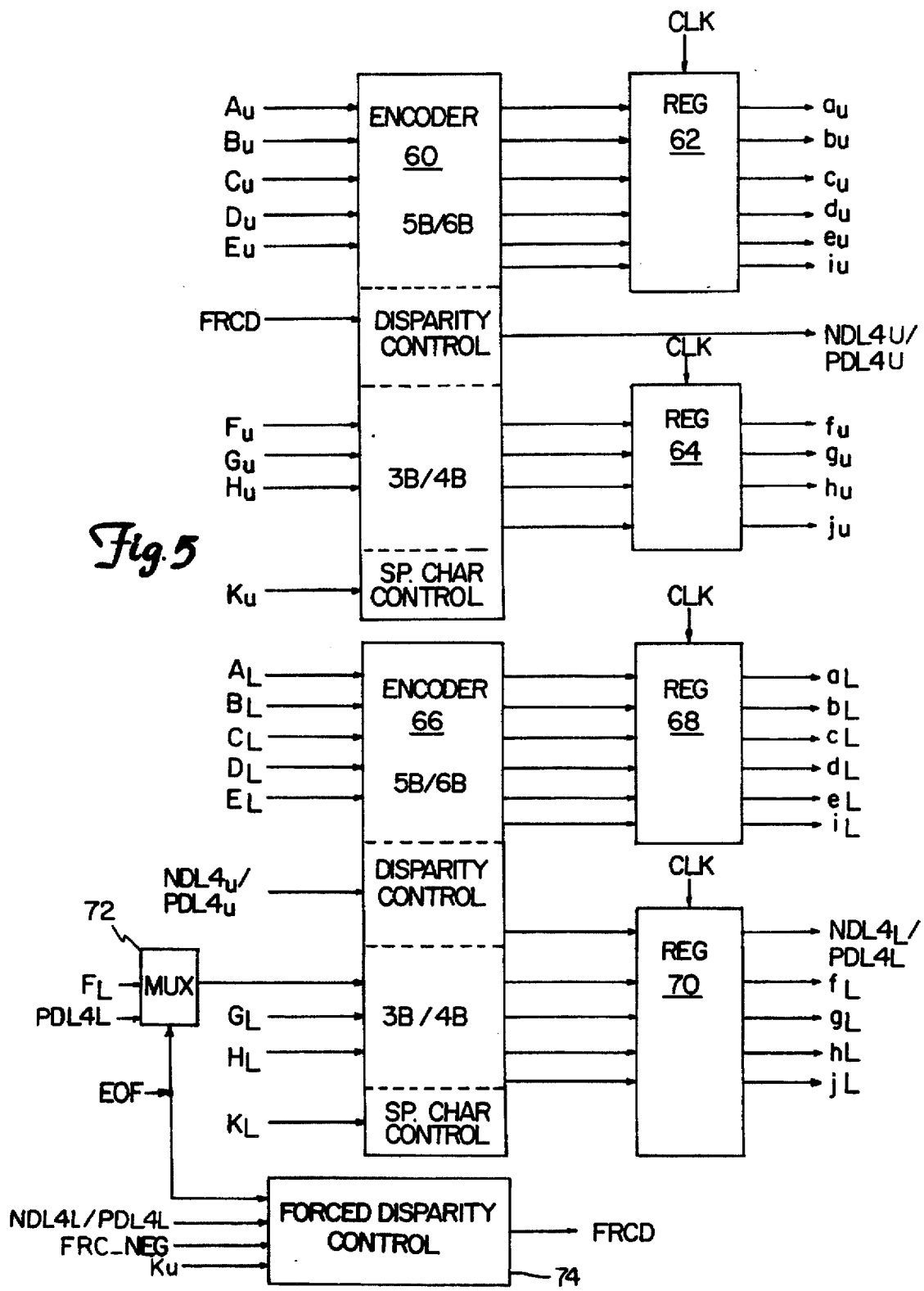
FIG. 5 is a block diagram representation of a 16B/20B encoder according to the present invention.
Figure 6:
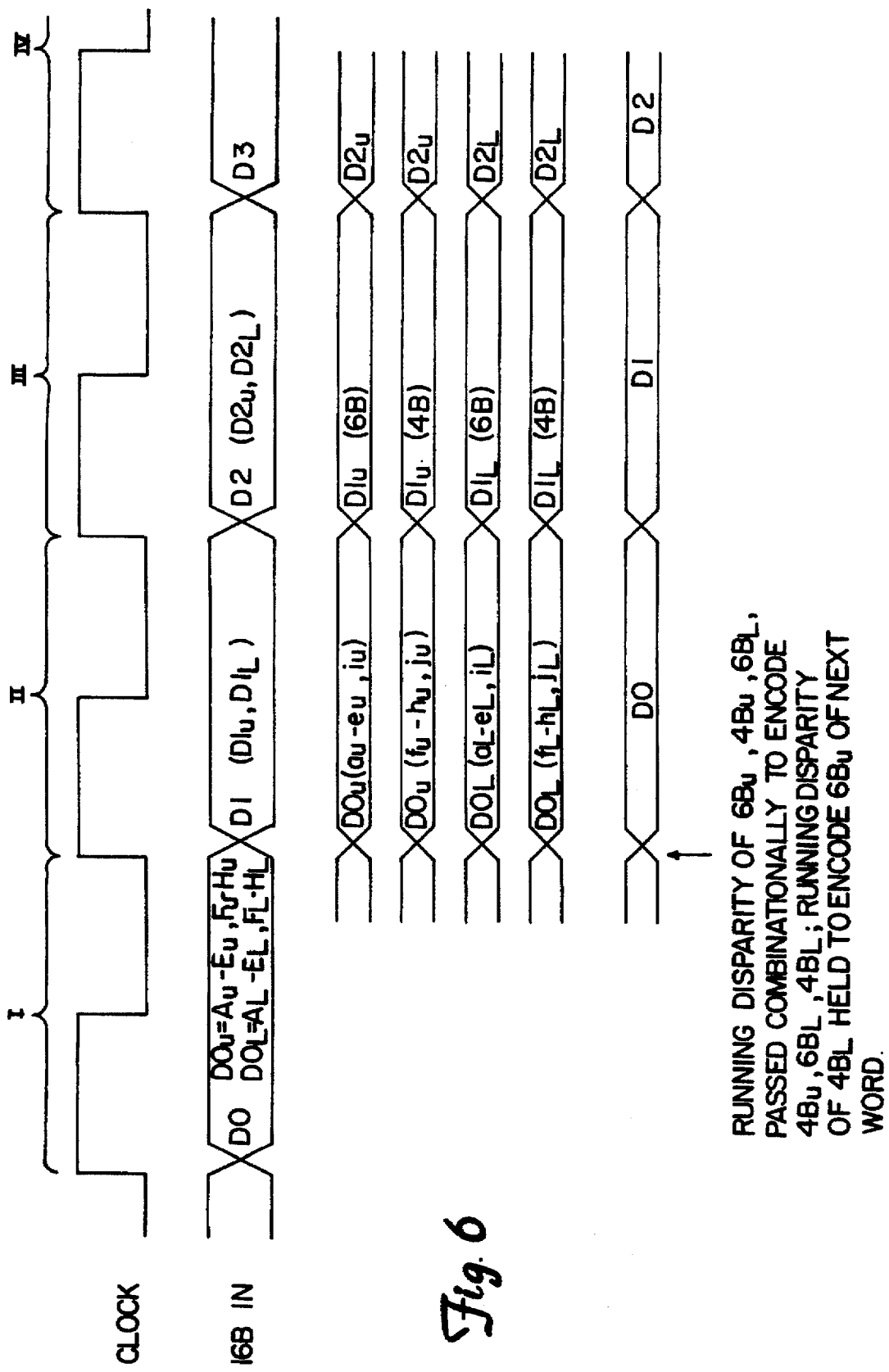
FIG. 6 is a timing diagram of the encoder illustrated in FIG. 5.

FIG. 5 is a block diagram of a 16B/20B encoder in accordance with the presently preferred embodiment of the present invention. The encoder comprises a first 8B/10B encoder 60 having a 5B/6B portion and a 3B/4B portion. The 5B/6B portion of encoder 60 receives the upper five bits $A_U-E_U$ of the upper portion of a 16-bit data word and encodes those bits to a 6-bit output designated as $a_U-i_U$.

These output bits are clocked into register 62 for output at the end of the clock cycle. As will be more apparent below, a running disparity bit is provided to the disparity control of encoder 60 to selectively complement the output to register 62. A control bit $K_U$ is input to the special character control of encoder 60 to generate special characters. Likewise, the 3-bit section $F_U$–$H_U$ of the upper portion of the data word is input to the 3B/4B portion of encoder 60. The output of the 3B/4B portion is provided to register 64 as output bits $f_U$–$i_U$ and $j_U$. The running disparity from the 5B/6B portion of encoder 60 is provided to the 3B/4B portion of encoder 60 on a combinational basis to selectively complement the output to register 64. In addition, a disparity output bit, NDL4U/PDL4U, from the 3B/4B portion of encoder 60 is supplied to the disparity control portion of encoder 66.

Meanwhile, the 6-bit section of the lower portion of the data word is applied as bits $A_L$–$E_L$ to the 5B/6B portion of encoder 66 which in turn provides its output to register 68 to provide the 6-bit output $a_L$–$e_L$, $i_L$. The running disparity from the 3B/4B portion of encoder 60 is provided through the disparity control of encoder 66 to selectively complement the output of the 5B/6B portion to register 68. A control bit $K_L$ is input to the special character control of encoder 66 to generate special characters. Finally, input bits $F_L$–$H_L$ are input to the 3B/4B portion of encoder 66. The running disparity of the 5B/6B portion is provided to the 3B/4B portion of encoder 66 to selectively complement the output of the 3B/4B portion. The 3B/4B portion of encoder 66 provides its output to register 70. The running disparity of the output of the 3B/4B portion of encoder 66 is stored in register 70 for output as NDL4L/PDL4L. Thus, one of the NDL4L and PDL4L bits is set active, and the other is set inactive, based upon the running disparity of the lower portion of the byte being negative or positive. Likewise, the NDL4U/DL4U bits are set active or inactive based on the running disparity of the lower portion of the upper byte being negative or positive.

Multiplexer 72 selects a bit value for $F_L$ based on the running disparity at the end of a frame. More particularly, multiplexer 72 is responsive to the PDL4L bit and $F_L$ bit and is gated by the end-of-frame (EOF) bit to set $F_L$ to binary zero when the running disparity at the end of a frame is negative and to set $F_L$ to binary one when the running disparity at the end of a frame is positive.

Forced disparity control 74 provides a FRCD bit to the disparity control of encoder 60 to force the running disparity of encoder 60 negative. This occurs if the running disparity of the 3B/4B portion of encoder 66 is negative (NDL4L active), or when a special character $K_U$, is input to control 74 when FRC_NEG is active. However, if the special character is an EOF bit, the running disparity is not forced negative. Hence, a negative running disparity is provided to the disparity control through forced disparity control 74, based on either a negative running disparity from the 3B/4B portion of encoder 66 or a forced negative disparity. This allows the disparity to be reset to negative without resetting the entire encoder or inputting a special pattern to bring the encoder back to negative.

Each of registers 62, 64, 68 and 70 is clocked by the positive edge of a clock pulse, particularly as illustrated in FIG. 6. Each of the encoder portions encodes the data word section during a single clock cycle. Thus, during clock cycle I, the 5B/6B portion of encoder 60 encodes the 5-bit section of the upper portion of the input data word to form a 6-bit section for the upper section of the output data word. The running disparity of the 6-bit upper portion is combinationally passed during the same clock cycle to the 3B/4B portion of encoder 60 to selectively complement or not complement the 4-bit output of the 3B/4B portion of encoder 60. More particularly, the running disparity is compared to the disparity of the output bits to selectively complement the output section. Thus, the output is complemented if its disparity is such as to make a negative running disparity more negative or a positive running disparity more positive. The output is not complemented if the disparity of the output is zero, or if it would make a positive running disparity more negative or a negative running disparity more positive. The running disparity of the 4-bit section of the upper portion of the word is combinationally passed to encoder 66 where it selectively complements the output of the 5B/6B portion to selectively complement the 6-bit section of the lower portion of the output data word. Likewise, the running disparity of the 6-bit section of the lower portion of the data word is combinationally passed to the 3B/4B portion of encoder 66 to selectively complement the 4-bit output of the lower portion of the data word.

The running disparity of the 4-bit section of the lower portion of the data word is output as NDL4L/PDL4L to register 70 where, upon the next clock cycle (clock cycle II), it is provided to the disparity control of encoder 60 through forced disparity control 74 to selectively complement the 6-bit output of the upper portion of the next data word ($D_1$), as described above.

One feature of the present invention is illustrated by a comparison of FIG. 6 to FIG. 4. The present invention encodes the full 16-bit data word in a single clock cycle, whereas the prior art required two clock cycles. Hence, the present invention permits encoding of the 16-bit input word to a 20-bit output word in a single clock cycle through the use of parallel 8B/10B encoders, each of which partition a respective 8-bit input portion of the word to 5-bit and 3-bit sections, respectively. Thus, the present invention partitions the 16-bit input word into two 8-bit portions, each having a 5-bit and 3-bit section. The running disparity from each of the four sections is combinationally passed to the next section to selectively complement outputs of each section during the single clock cycle, thereby selectively adjusting the running disparity. The running disparity of the 4-bit section of the lower portion of one data word is provided during the next clock cycle to selectively complement the 6-bit output of the upper portion of the next data word. Thus, loop latency associated with the apparatus of FIG. 3 is substantially reduced. Hence, with the present invention encodes the entire 16-bit input data word to a 20-bit output in a single clock cycle. Moreover, the present invention eliminates the need for registers 34 and 40 of the prior art (FIG. 3), thereby reducing gate count.

Although the present invention has been described with reference to preferred embodiments, workers skilled in the art will recognize that changes may be made in form and detail without departing from the spirit and scope of the invention.

What is claimed is:

1. In a binary data encoding apparatus for producing a DC balanced run length limited rate 16B/20B code from an unconstrained input data stream that includes consecutive 16-bit data blocks, in which the encoding apparatus includes a pair of parallel 8B/10B encoders each having a 5B/6B and a 3B/4B encoder portion responsive to respective 5-bit and 3-bit sub-blocks to produce respective 6-bit and 4-bit output sub-blocks, each encoder portion being responsive to the disparity of its current output sub-block and a running disparity associated with another sub-block to selectively complement the bits of its sub-block to reduce running disparity, the improvement comprising disparity processing means for combinationally passing the running disparity of each 6-bit output sub-block to the 3B/4B encoder of the associated 8B/10B encoder and the running disparity of the 4-bit output sub-block associated with a first of the 8B/10B encoders to the 5B/6B encoder of a second of the 8B/10B encoders, thereby selectively complementing the 4-bit output sub-blocks and the 6-bit output sub-block associated with the second 8B/10B encoder for a current data block, the disparity processing means additionally holding and processing the running disparity of the 4-bit output sub-block associated with the second 8B/10B encoder to the 5B/6B encoder of the first 8B/10B encoder, thereby selectively complementing the 6-bit output sub-block associated with the first 8B/10B encoder for the next data block.

2. Apparatus according to claim 1, further including a forced disparity control responsive a special character bit and a forced disparity bit to force the running disparity of the 5B/6B encoder of the first encoder to a selected polarity.

3. The encoder according to claim 2, wherein the forced disparity control passes the running disparity of the selected polarity of the immediately prior 4-bit output sub-block of the second 8B/10B encoder to the 5B/6B encoder of the first 8B/10B encoder.

4. The encoder according to claim 1, further including end-of-frame control responsive to the running disparity of the immediately prior 4-bit output sub-block of the second 8B/10B encoder and an end-of-frame bit to selectively complement a bit of the current 3-bit input sub-block.

5. A binary data encoding apparatus for producing a DC balanced run length limited rate 16B/20B code from an unconstrained input data stream that includes consecutive 16-bit data blocks, comprising:

a first 8B/10B encoder for receiving an upper 8 bits of a data block, the first 8B/10B encoder comprising:
  a 5B/6B encoder for encoding a input first sub-block consisting of 5 contiguous input data bits of the upper 8 bits of the data block into a first output data sub-block consisting of 6 bits,
  a 3B/4B encoder for encoding a second input sub-block consisting of 3 contiguous input data bits of the upper 8 bits of the data block into a second output data sub-block consisting of 4 bits,
  means for determining a disparity of the first and second current output sub-blocks being encoded and for determining a running disparity associated with each of the first and second output sub-blocks,
  the 3B/4B encoder of the first 8B/10B encoded being responsive to the disparity of the current second output sub-block and to the running disparity of the current first output sub-block to selectively complement the current second output sub-block to reduce the running disparity of the second output sub-block;
second 8B/10B encoder for receiving a lower 8 bits of the data block, the second 8B/10B encoder comprising:
  a 5B/6B encoder for encoding a third input sub-block consisting of 5 contiguous input data bits of the lower 8 bits of the data block into a third output data sub-block consisting of 6 bits,
  a 3B/4B encoder for encoding a fourth input sub-block consisting of 3 contiguous input data bits of the lower 8 bits of the data block into a fourth output data sub-block consisting of 4 bits,
  means for determining a disparity of the third and fourth current output sub-blocks being encoded and for determining a running disparity associated with each of the third and fourth output sub-blocks, the 5B/6B encoder of the second 8B/10B encoder being responsive to the disparity of the current third output sub-block and to the running disparity of the current second output sub-block to selectively complement the current third output sub-block to reduce the running disparity of the third output sub-block,
3B/4B encoder of the second 8B/10B encoder being responsive to the disparity of the current fourth output sub-block and to the running disparity of the current third output sub-block to selectively complement the current fourth output sub-block to reduce the running disparity of the fourth output sub-block;
the 5B/6B encoder of the first 8B/10B encoder being responsive to the disparity of the current first output sub-block and to the running disparity of the immediately prior fourth output sub-block to selectively complement the current first output sub-block to reduce the running disparity of the first output sub-block.

6. The encoder according to claim 5, wherein the disparity determining means combinationally passes the running disparity of the first, second and third output sub-blocks to the respective 3B/4B and 5B/6B encoders for a first data block, and buffers the running disparity of the fourth output sub-block for the 5B/6B encoder of the first 8B/10B encoder for the next data block.

7. The encoder according to claim 5, wherein the first 8B/10B encoder includes first control means responsive to a first special character control bit for generating a first special 10-bit character output based on the upper 8 bits of the data block, and wherein the second 8B/10B encoder includes second control means responsive to a second special character control bit for generating a second special 10-bit character output based on the lower 8 bits of the data block.

8. The encoder according to claim 5, further including a forced disparity control responsive a special character bit and a forced disparity bit to force the running disparity of the 5B/6B encoder of the first encoder to a selected polarity.

9. The encoder according to claim 8, wherein the forced disparity control passes the running disparity of the selected polarity of the immediately prior fourth output sub-block to the 5B/6B encoder of the first encoder.

10. The encoder according to claim 5, further including end-of-frame control responsive to the running disparity of the immediately prior fourth output sub-block and an end-of-frame bit to selectively complement a bit of the fourth input sub-block.

11. In a binary data encoding apparatus for producing a DC balanced run length limited rate 16B/20B code from an unconstrained input data stream that includes consecutive 16-bit data blocks, in which the encoding apparatus includes a pair of parallel 8B/10B encoders each having a 5B/6B and a 3B/4B encoder portion responsive to respective 5-bit and 3-bit sub-blocks to produce respective 6-bit and 4-bit output sub-blocks, each encoder portion being responsive to the disparity of its current output sub-block and a running disparity associated with another sub-block to selectively complement the bits of its sub-block to reduce running disparity, the process comprising:

(a) partitioning a 16-bit data block into an upper 5-bit sub-block, an upper 3-bit sub-block, a lower 5-bit sub-block and a lower 3-bit sub-block;
(b) simultaneously
  (i) encoding the upper 5-bit sub-block in a first 5B/6B encoder portion to produce an upper 6-bit sub-block,
  (ii) encoding the upper 3-bit sub-block in a first 3B/4B encoder portion to produce an upper 4-bit sub-block,
  (iii) encoding the lower 5-bit sub-block in a second 5B/6B encoder portion to produce a lower 6-bit sub-block, and (iv) encoding the lower 3-bit sub-block in a second 3B/4B encoder portion to produce a lower 4-bit sub-block;

(c) simultaneously combinationally passing
  (i) the running disparity of the upper 6-bit sub-block to the first 3B/4B encoder portion,
  (ii) the running disparity of the upper 4-bit sub-block to the second 5B/6B encoder portion, and
  (iii) the running disparity of the lower 6-bit sub-block to the second 3B/4B encoder portion; and (d) subsequent to step (c), combining the running disparity of the lower 4-bit sub-block to the first 5B/6B encoder.

12. The process of claim 11, wherein steps (a), (b) and (c) are performed during a first clock cycle and step (d) is performed during a second clock cycle.

13. The process of claim 11, including generating a first special 10-bit character output based on the upper 5-bit and upper 3-bit sub-blocks, and generating a second special 10-bit character output based on the lower 5-bit and lower 3-bit sub-blocks.

14. The process of claim 11, including forcing the running disparity provided to the first 5B/6B encoder portion to a selected polarity based on a special character bit and a forced disparity bit.

15. The process of claim 11, including selectively complementing a selected bit of the lower 3-bit sub-block based upon the running disparity of the immediately prior lower 4-bit sub-block and an end-of-frame bit.

* * * * *

UNITED STATES PATENT AND TRADEMARK OFFICE
CERTIFICATE OF CORRECTION

PATENT NO. : 5,663,724

DATED : SEPTEMBER 2, 1997

INVENTOR(S) : JUDY LYNN WESTBY

It is certified that error appears in the above-indentified patent and that said Letters Patent is hereby corrected as shown below:

Column 2, line 45, after "Considering" insert

--a 16-bit input data word composed of two 8-bit portions, the 16B/20B encoder provided the upper 8-bit portion during a first clock cycle and the lower 8-bit portion during the next clock cycle.

--However the 16B/20B encoder required buffering both before and after the encoder to permit the 3-bit and 5-bit codes to be staged in and the 4-bit and 6-bit codes to be staged out and alignment of the full 20-bit output word. As in the prior Franaszek et al. design, the additional buffering represented increased gate count for the fibre channel port. Moreover, the parallel version required at least two clock cycles to encode a 16-bit input word to a 20-bit output word, thereby affecting system timing.

--SUMMARY OF THE INVENTION

--The present invention is directed to an improved parallel 8B/10B encoder for use in FCALs that eliminates buffering both before and after the encoder (thereby reducing the gate count over the prior art), outputs the entire 20-bit word in a single clock cycle, and removes certain loop latency encountered by the prior art.

--In one form of the invention, a binary data encoding apparatus produces a DC balanced run length limited rate 16B/20B code from an unconstrained input data stream that includes consecutive 16-bit data blocks. The encoding apparatus includes a pair of parallel 8B/10B encoders each having a 5B/6B and a 3B/4B encoder portion responsive to respective 5-bit and 3-bit sub-blocks to produce respective 6-bit and 4-bit output sub-blocks. Each encoder portion is responsive to input data and a running disparity associated with another sub-block to selectively complement the bits of its output sub-block to reduce running disparity. The running disparity of each 6-bit output sub-block is combinationally passed

UNITED STATES PATENT AND TRADEMARK OFFICE
CERTIFICATE OF CORRECTION

PATENT NO. : 5,663,724
DATED : SEPTEMBER 2, 1997
INVENTOR(S) : JUDY LYNN WESTBY

It is certified that error appears in the above-indentified patent and that said Letters Patent is hereby corrected as shown below:

to the 3B/4B encoder of the associated 8B/10B encoder and the running disparity of the 4-bit output sub-block associated with a first of the 8B/10B encoders is combinationally passed to the 5B/6B encoder--;

Col. 3, line 51, delete "a 16-bit input data word composed of two";

Delete Col. 3, line 52 through column 4, line 19, in its entirety;

Col. 4, line 20, delete "combinationally passed to the 5B/6B encoder"

Col. 9, line 35, delete "NDL4U/DL4U", insert --DNL4U/PDL4U--

Col. 11, line 48, delete "encoded", insert --encoder--

Signed and Sealed this

First Day of September, 1998

Attest:

BRUCE LEHMAN

Attesting Officer

Commissioner of Patents and Trademarks